United States Patent
Louh

(10) Patent No.: US 7,988,890 B2
(45) Date of Patent: Aug. 2, 2011

(54) METHOD FOR MANUFACTURING LENS MOLD

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 247 days.

(21) Appl. No.: 12/494,286

(22) Filed: Jun. 30, 2009

(65) Prior Publication Data
US 2010/0276825 A1    Nov. 4, 2010

(30) Foreign Application Priority Data

Apr. 30, 2009   (CN) .......................... 2009 1 0302066

(51) Int. Cl.
*B29D 11/00* (2006.01)

(52) U.S. Cl. ........ 264/2.5; 264/1.36; 264/227; 425/808; 430/321

(58) Field of Classification Search .................. 264/1.1, 264/1.36, 1.38, 2.5, 219, 227; 425/808; 430/321, 430/322, 324
See application file for complete search history.

(56) References Cited

U.S. PATENT DOCUMENTS

| | | | |
|---|---|---|---|
| 7,005,243 B2 * | 2/2006 | Chen | 430/320 |
| 7,147,993 B2 * | 12/2006 | Leu et al. | 430/321 |
| 2005/0142499 A1 * | 6/2005 | Chen | 430/321 |
| 2010/0248161 A1 * | 9/2010 | Louh | 430/324 |

* cited by examiner

*Primary Examiner* — Mathieu D. Vargot
(74) *Attorney, Agent, or Firm* — Raymond J. Chew

(57) ABSTRACT

In a method for manufacturing a lens mold, a raw mold is provided. The raw mold defines a cavity therein. The cavity defines a raw molding surface. The raw molding surface includes a molding surface portion. The molding surface portion includes a center. Photoresist material is filled in the cavity, covering the molding surface portion. A photo mask is provided. The photo mask defines a through hole. The size through hole is the same as the molding surface portion of the lens mold. The photo mask is placed above the photoresist material with the through hole aligned with the center. The photoresist material is exposed and developed to form a photoresist portion. A rigid molding material is filled in the cavity. The resist portion is removed to expose the molding surface.

9 Claims, 6 Drawing Sheets

METHOD FOR MANUFACTURING LENS MOLD

BACKGROUND

1. Technical Field

The present disclosure relates to a method for manufacturing a lens mold.

2. Description of Related Art

Generally, lens molds have a convex or concave molding surface for shaping the lenses. To precisely shape the lenses, the molding surface requires extreme precision. However, lens molds are often manufactured by a cutting process which may not be adequate to provide the required precision.

Therefore, it is desirable to provide a method for manufacturing a lens mold which can overcome the limitations described.

DETAILED DESCRIPTION

Figure 1:
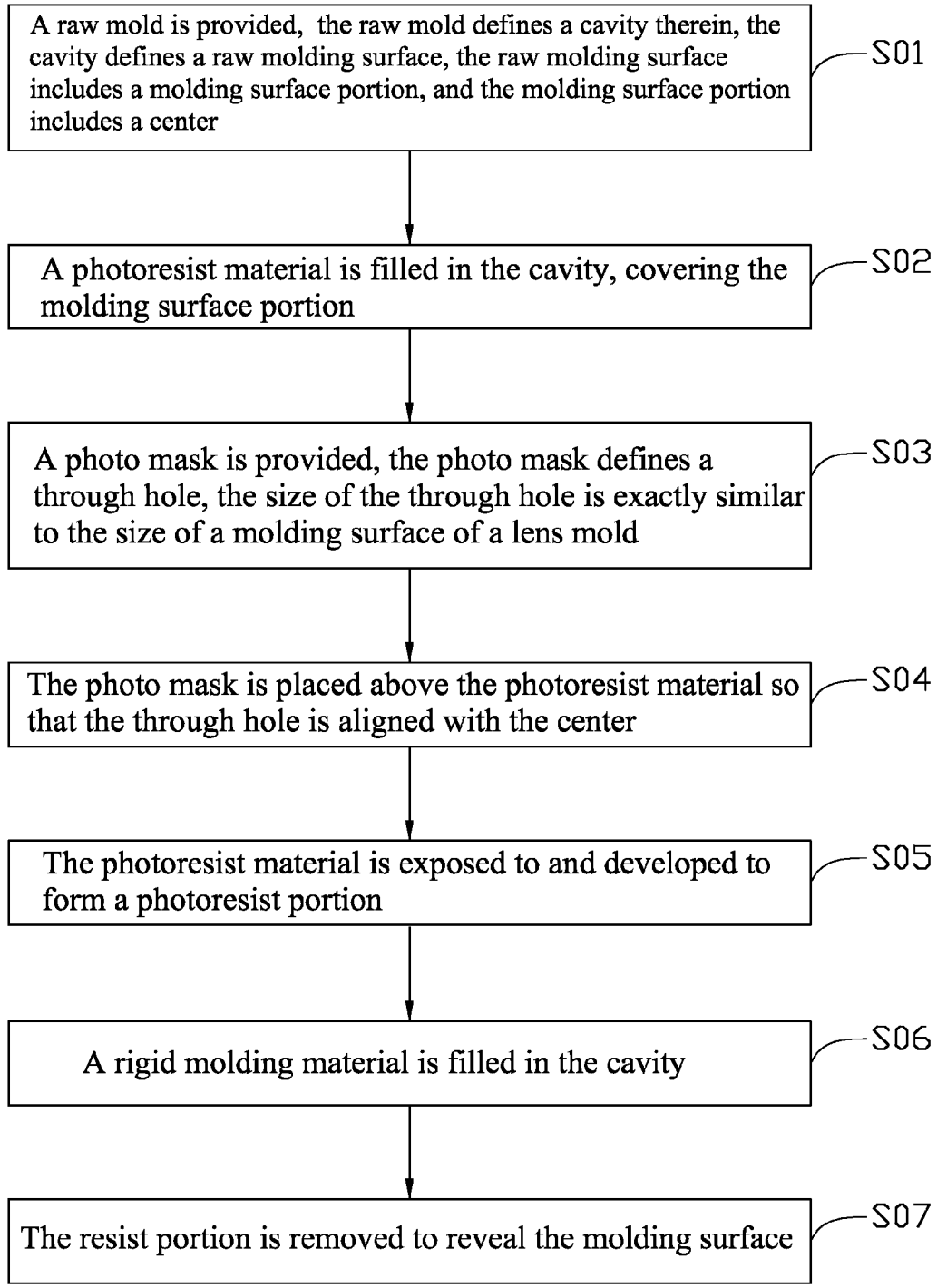
FIG. 1 is a flowchart of a method for manufacturing a lens mold.

Referring to FIG. 1, a method for manufacturing a lens mold 60 (see FIG. 6), according to an exemplary embodiment, is disclosed. The lens mold 60 is for molding lenses (not shown). The method includes the following steps S01-S07.

Figure 2:
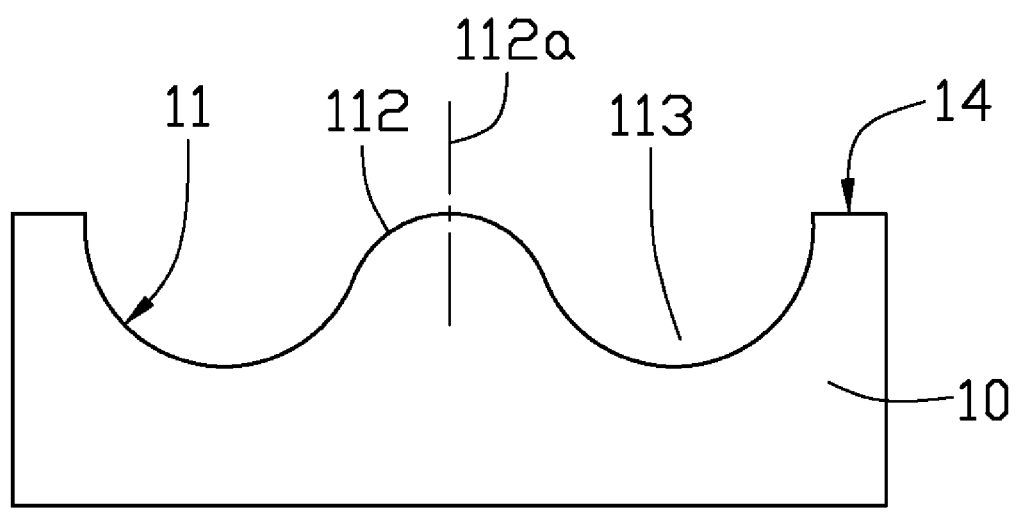
FIGS. 2-6 are schematic views of successive stages of the method of FIG. 1.

Referring to FIG. 2, in step S01, a raw mold 10 is provided. The raw mold 10 includes a top surface 14 and defines a cavity 13 in the top surface 14. The cavity 13 defines a raw molding surface 11. The raw molding surface 11 includes a molding surface portion 112. The molding surface portion 112 has a center 112a (shown as an axis in FIG. 2), which can be marked on the molding surface portion 112 during manufacture of the raw mold 10. The raw mold 10 can be manufactured by a cutting process. Preferably, the molding portion 112 is below the top surface 14. In this embodiment, the molding surface portion 112 is convex and bugles towards the top surface 14 for shaping a concave optical lens surface (not shown). However, alternatively, the molding surface portion can be concave for shaping a convex optical lens surface (not shown).

Figure 3:
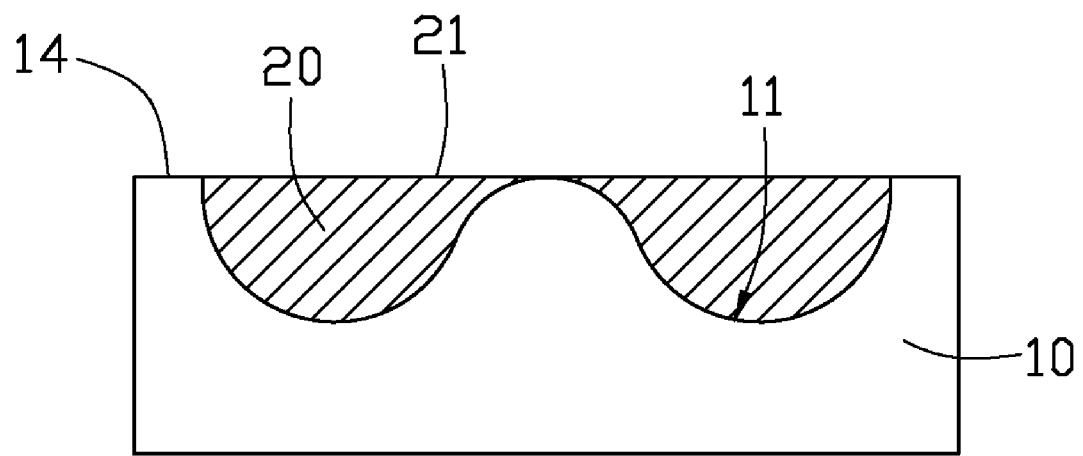

Referring to FIG. 3, in step S02, a photoresist material 20 is filled in the cavity 13, covering the molding surface portion 112. Preferably, the photoresist material 20 forms a photoresist surface 21 flush with the top surface 14. The photoresist material 20 can be a negative resist or a positive resist.

Figure 4:
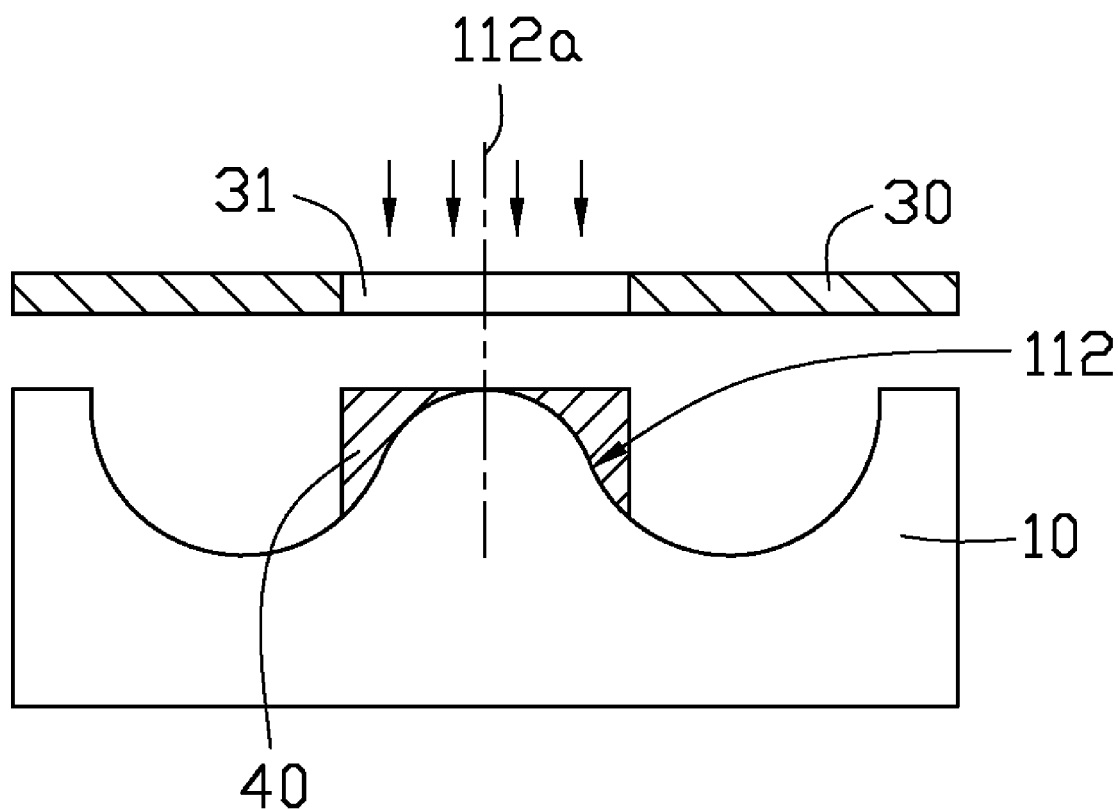

Referring to FIG. 4, in step S03, a photo mask 30 is provided. The photo mask 30 defines a through hole 31 the same size as a molding surface 61 of the lens mold 60 (see FIG. 7). The photo mask 30 can be made by various precision machining techniques.

In step S04, the photo mask 30 is placed above the photoresist material 20 aligning the through hole 31 with the center 112a. This can be carried out utilizing various precision positioning techniques.

In step S05, the photoresist material 20 is exposed to, for example, ultraviolet (UV) light, and developed to form a photoresist portion 40 which precisely covers the molding surface portion 112.

Figure 5:
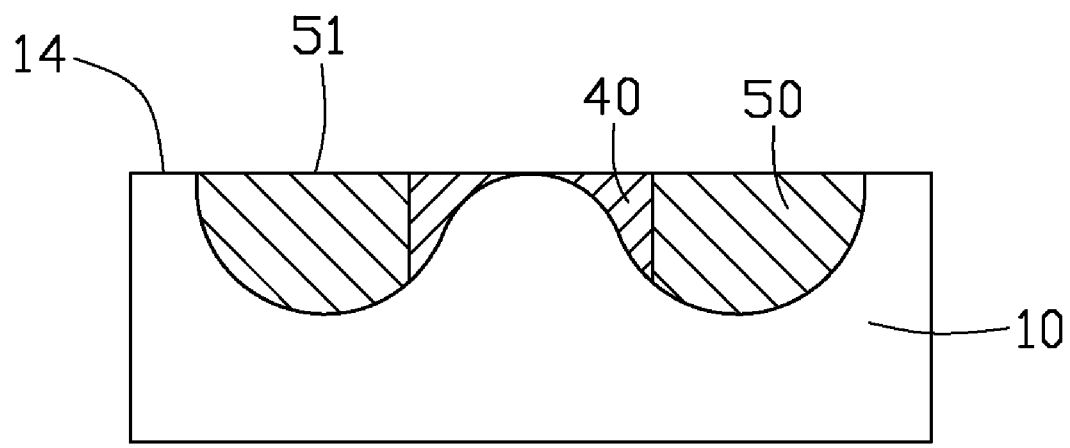

Referring to FIG. 5, in step S06, a rigid molding material 50 is filled in the cavity 13 and forms a rigid surface 51 flush with the top surface 14. The rigid molding material 50 is metal, such as nickel-iron alloy (Ni—Fe), or nickel-cobalt alloy (Ni—Co).

Figure 6:
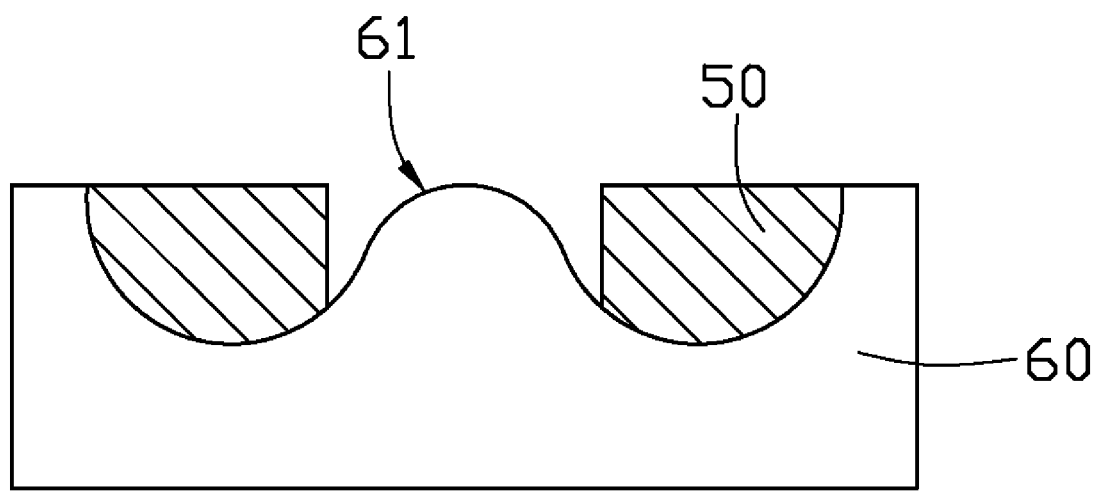

Referring to FIG. 6, in step S07, the resist portion 40 is removed to expose the molding surface 61.

The molding surface 61, formed by photolithography, provides enhanced precision compared to those formed by cutting.

While various exemplary and preferred embodiments have been described, it is to be understood that the invention is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A method for manufacturing a lens mold, the lens mold comprising a molding surface, the method comprising:
    providing a raw mold defining a cavity therein, the cavity defining a raw molding surface, the raw molding surface comprising a molding surface portion, and the molding surface portion comprising a center;
    filling the cavity using a photoresist material to cover the molding surface portion;
    providing a photo mask defining a through hole having the same size as the molding surface portion;
    placing the photo mask above the photoresist material;
    aligning the through hole of the photo mask with the center of the molding surface portion;
    exposing and developing the photoresist material to form a photoresist portion;
    filling the cavity using a rigid molding material; and
    removing the photoresist portion.

2. The method of claim 1, wherein the raw mold comprises a top surface in which the cavity is defined and below which the molding surface portion is located.

3. The method of claim 2, wherein the molding surface portion is convex and bulges toward the top surface.

4. The method of claim 2, wherein the molding surface portion is concave.

5. The method of claim 1, wherein the photoresist material is a negative resist or positive resist.

6. The method of claim 2, wherein the photoresist material forms a photoresist surface flush with the top surface.

7. The method of claim 1, wherein the molding material is metal.

8. The method of claim 1, wherein the molding material is nickel-iron alloy or nickel-cobalt alloy.

9. The method of claim 2, wherein the molding material forms a rigid surface flush with the top surface.

* * * * *